(12) United States Patent
Kobayashi et al.

(10) Patent No.: US 7,829,833 B2
(45) Date of Patent: Nov. 9, 2010

(54) ARRANGING AND/OR SUPPORTING AN IMAGE PICKUP DEVICE IN AN IMAGE PICKUP APPARATUS

(75) Inventors: Yuji Kobayashi, Hachioji (JP); Mitsuhiro Taira, Hino (JP)

(73) Assignee: Olympus Imaging Corp., Tokyo (JP)

( * ) Notice: Subject to any disclaimer, the term of this patent is extended or adjusted under 35 U.S.C. 154(b) by 70 days.

(21) Appl. No.: 11/440,214

(22) Filed: May 23, 2006

(65) Prior Publication Data

US 2006/0278810 A1 Dec. 14, 2006

(30) Foreign Application Priority Data

May 24, 2005 (JP) .............................. 2005-151335
Feb. 23, 2006 (JP) .............................. 2006-047367

(51) Int. Cl.
*H01L 27/00* (2006.01)
(52) U.S. Cl. .............................. 250/208.1; 250/214 R; 250/239; 257/431; 257/433; 257/778
(58) Field of Classification Search .............. 250/208.1, 250/214 R, 239; 257/778, 431–434, 678
See application file for complete search history.

(56) References Cited

U.S. PATENT DOCUMENTS

| | | | | | |
|---|---|---|---|---|---|
| 5,865,935 | A | * | 2/1999 | Ozimek et al. | 156/303.1 |
| 5,945,741 | A | * | 8/1999 | Ohsawa et al. | 257/777 |
| 6,414,299 | B1 | * | 7/2002 | Churei | 250/214.1 |
| 2003/0054583 | A1 | * | 3/2003 | Waldman et al. | 438/48 |
| 2005/0073602 | A1 | | 4/2005 | Kamoda et al. | |
| 2005/0094534 | A1 | * | 5/2005 | Yoon et al. | 369/112.01 |
| 2005/0285244 | A1 | * | 12/2005 | Chen | 257/678 |
| 2006/0056830 | A1 | * | 3/2006 | Tanaka et al. | 396/55 |
| 2006/0255253 | A1 | * | 11/2006 | Hsiao et al. | 250/239 |

FOREIGN PATENT DOCUMENTS

CN 1605922 4/2005

(Continued)

OTHER PUBLICATIONS

Kanda et al. (Japanese Patent No. JP-02001177023A, "English Machine Translation").*

(Continued)

*Primary Examiner*—Georgia Y Epps
*Assistant Examiner*—Francis M Legasse, Jr.
(74) *Attorney, Agent, or Firm*—Straub & Pokotylo; John C. Pokotylo

(57) ABSTRACT

An image pickup apparatus includes: an image pickup device comprising a bare chip and having an image pickup area and a mount area on the same face; an electric board having the image pickup device mounted thereon; and a support having an opening. The support is disposed on the rear face of the mount surface of the image pickup device such that the rear face of the image pickup device is opposed to and exposed through the opening. The opening is supplied with an adhesive to fix the support to the image pickup device. Thus, the image pickup apparatus to which the support can be fixed with a sufficient adhesive strength can be provided.

29 Claims, 11 Drawing Sheets

FOREIGN PATENT DOCUMENTS

| | | | |
|---|---|---|---|
| JP | 2001177023 A | * | 6/2001 |
| JP | 2001-285697 | | 10/2001 |
| JP | 2002-051268 | | 2/2002 |
| JP | 2002-077683 | | 3/2002 |
| JP | 2002-218293 | | 8/2002 |
| JP | 2003-204457 | | 7/2003 |
| JP | 2005-072736 | | 3/2005 |

OTHER PUBLICATIONS

Japanese Unexamined Utility Model Application Laid-Open Publication No. 60-068755, May 15, 1985 (11 pgs.) with partial translation (1 pg.).

Office Action for Japanese Patent Application No. 2005-151335, mailed Jan. 26, 2010 (2 pgs.) with partial translation (1 pg.).

* cited by examiner

ARRANGING AND/OR SUPPORTING AN IMAGE PICKUP DEVICE IN AN IMAGE PICKUP APPARATUS

CROSS REFERENCES TO RELATED APPLICATIONS

This application claims the benefit of Japanese Applications No. 2005-151335 filed in Japan on May 24, 2005 and No. 2006-047367 filed in Japan on Feb. 23, 2006, the entire contents of each of which are incorporated herein by their reference.

BACKGROUND OF THE INVENTION

1. Field of the Invention

The present invention relates to image pickup units and image pickup apparatuses, and in particular, to an image pickup unit in which an image pickup device comprising a bare chip is bonded on an electric board and an image pickup apparatus including the image pickup unit.

2. Description of the Related Art

Electronic apparatuses, such as digital cameras, having the following structure are in practical, widespread use: A subject image based on light, which is reflected by a subject and passes through a photographic optical system, is formed on the light receiving surface of an image pickup device (e.g., a charge coupled device (CCD)), comprising a bare chip, disposed in a predetermined position and the subject image can be recorded as image data or the like in a predetermined format.

As an image pickup apparatus, such as a digital camera, there is an apparatus using an image pickup device comprising a bare chip, i.e., having a bare-chip mount structure.

For example, a cover glass is adhered on one surface of a flexible printed circuit board (FPC) using an adhesive. An image pickup device comprising a bare chip is connected to the other surface of the FPC through electrode pads and bumps. In this instance, the light receiving surface of the image pickup device is opposed to the cover glass.

The electrode pads and bumps are covered with an adhesive. Consequently, the FPC is bonded on the image pickup device by the adhesive, thus sealing the light receiving surface (image pickup area) of the image pickup device.

As described above, in the bare-chip mount structure, components, such as the bare chip (image pickup device) and the cover glass, each comprising a rigid plate material are fixed to the FPC comprising a flexible plate material using adhesive. The image pickup devices having the bare-chip mount structure are known.

Such a unitized device (image pickup unit) is incorporated into each of various electronic apparatuses, e.g., digital cameras. The unit provides an image pickup function of each apparatus.

In the above-described image pickup unit, the cover glass (light-transmissive material) is disposed in such a manner that the surface of the cover glass opposed to the image pickup device is in contact with the front surface of the image pickup unit. Thus, the image pickup device can be aligned with the image pickup unit in the direction along the optical axis of a lens unit with high accuracy.

SUMMARY OF THE INVENTION

According to the present invention, there is provided an image pickup apparatus including: an electric board having connection patterns in one face; an image pickup device comprising a bare chip and having an image pickup area and a mount area on the same face, the image pickup area of the image pickup device being electrically connected to the connection patterns in the one face of the electric board; and a support for supporting the image pickup device.

Other features and advantages of the present invention will become more apparent from the following description.

DESCRIPTION OF THE PREFERRED EMBODIMENTS

Figure 1:
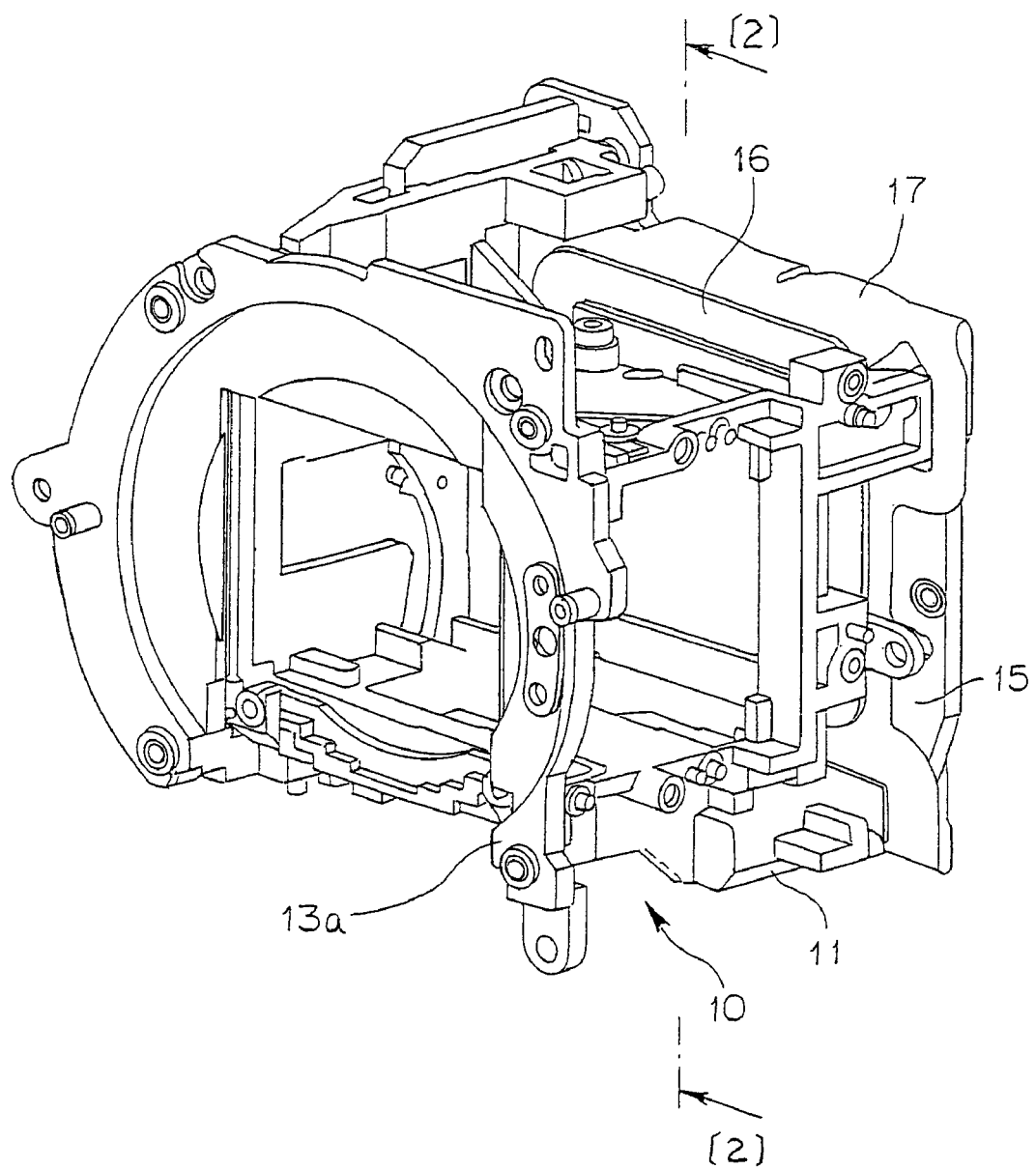
FIG. 1 is a perspective view of a mirror box of a digital single-lens reflex camera to which an image pickup unit according to a first embodiment of the present invention is applied.
Figure 2:
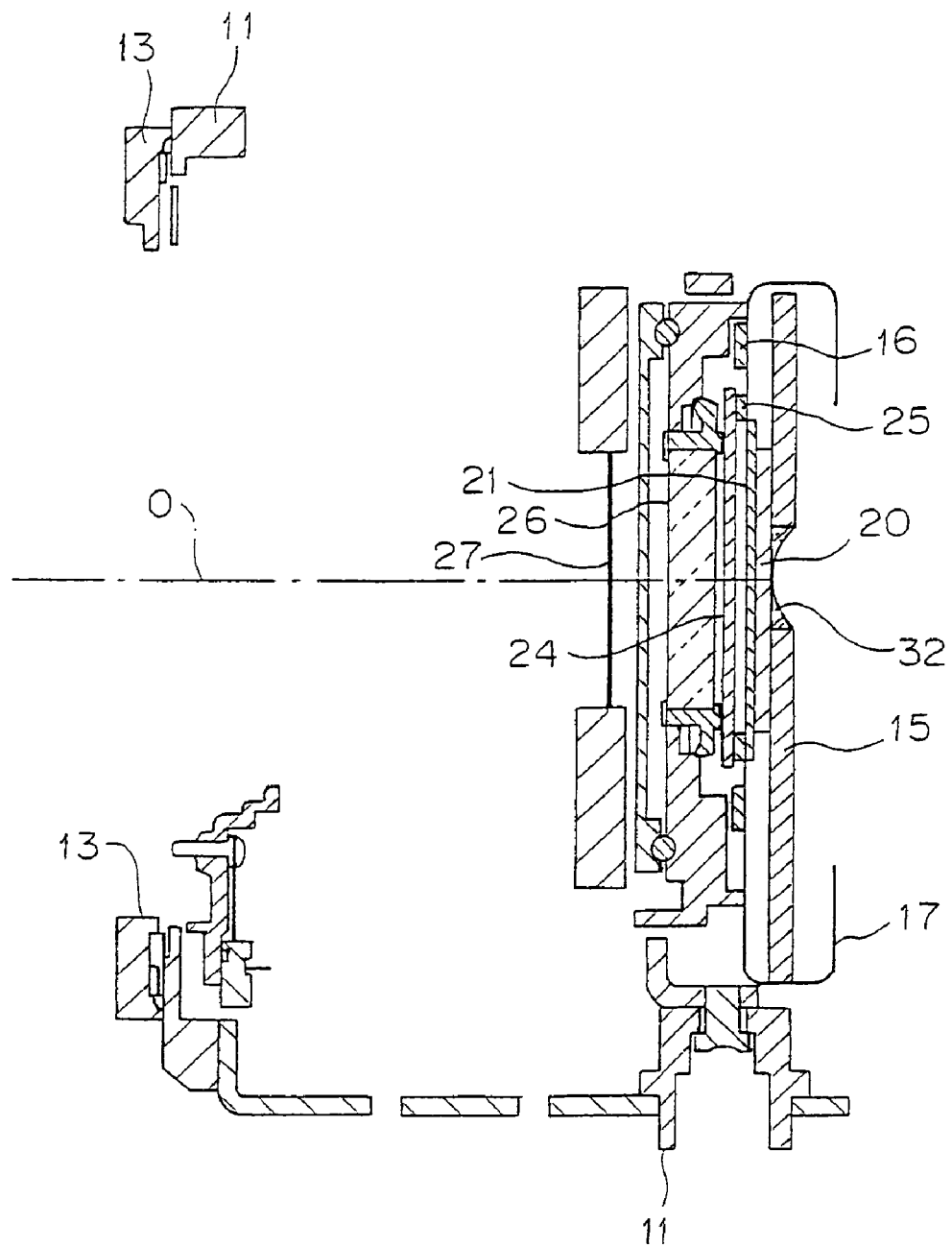
FIG. 2 is a sectional view taken along the line [2]-[2] of FIG. 1.
Figure 3:
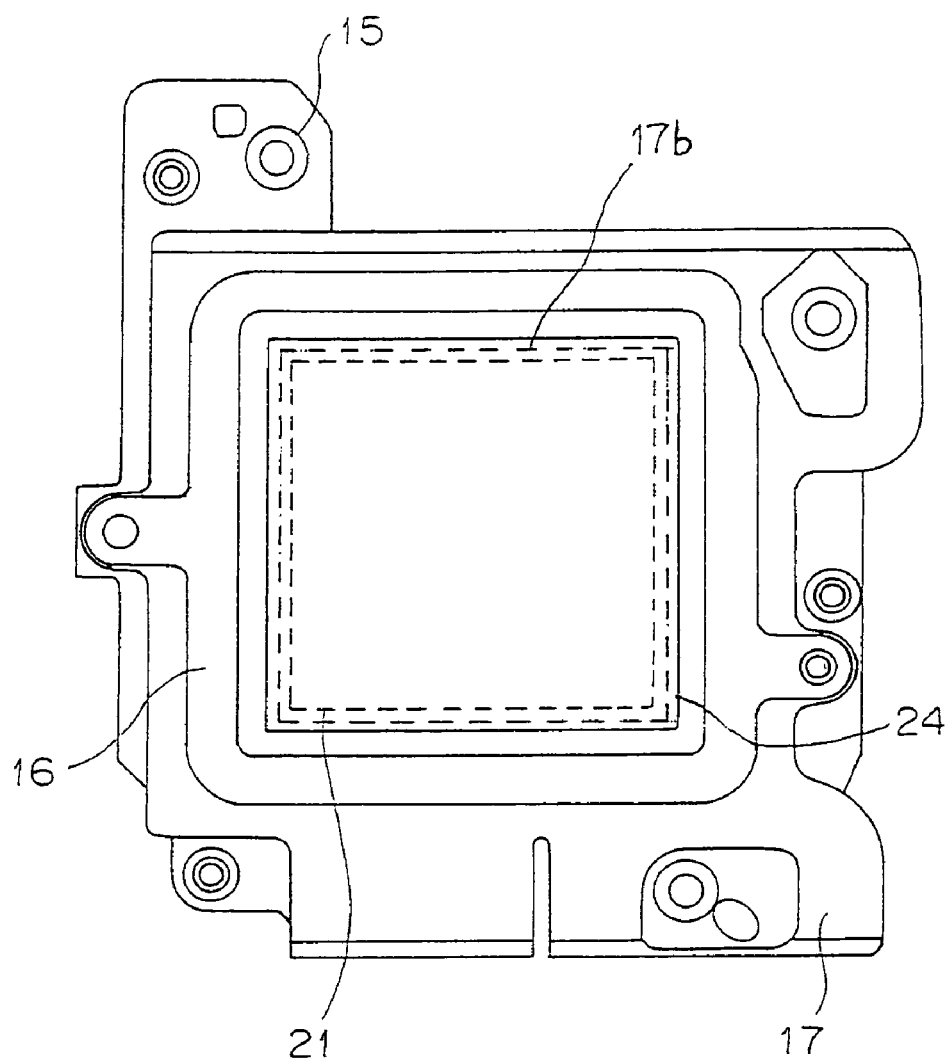
FIG. 3 is a front view of the image pickup unit according to the first embodiment.
Figure 4:
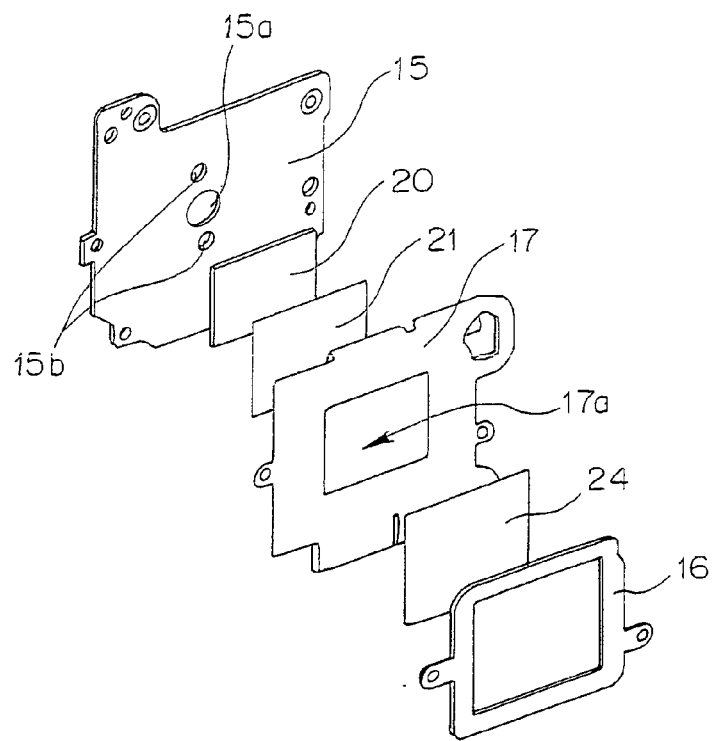
FIG. 4 is an exploded perspective view of the image pickup unit according to the first embodiment as viewed from the front.
Figure 5:
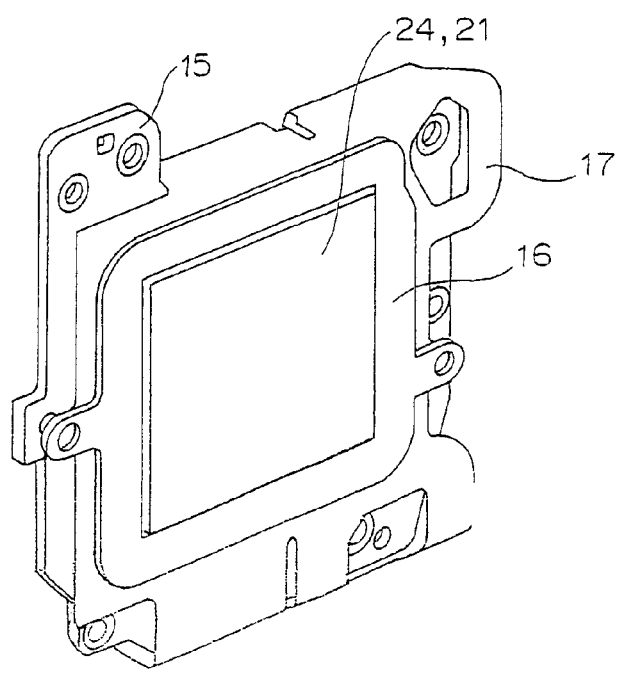
FIG. 5 is a perspective view of the completely assembled image pickup unit according to the first embodiment as viewed from the front.
Figure 6:
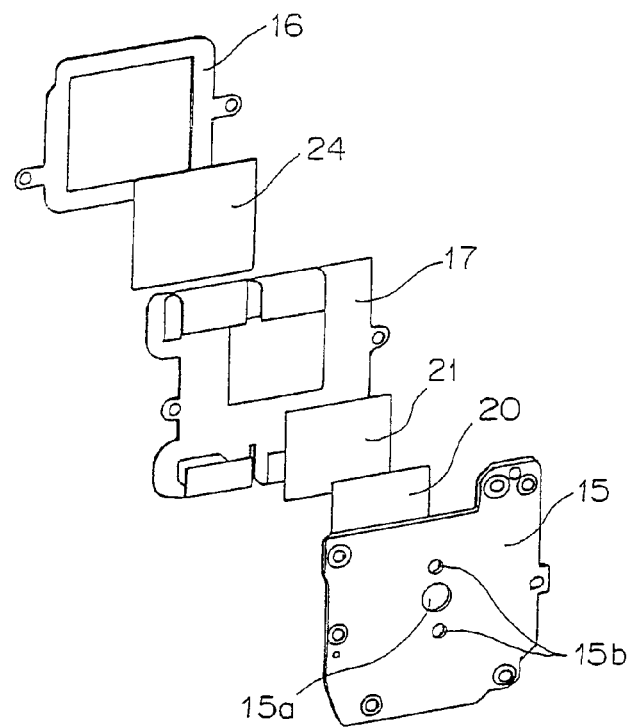
FIG. 6 is an exploded perspective view of the image pickup unit according to the first embodiment as viewed from the rear.
Figure 7:
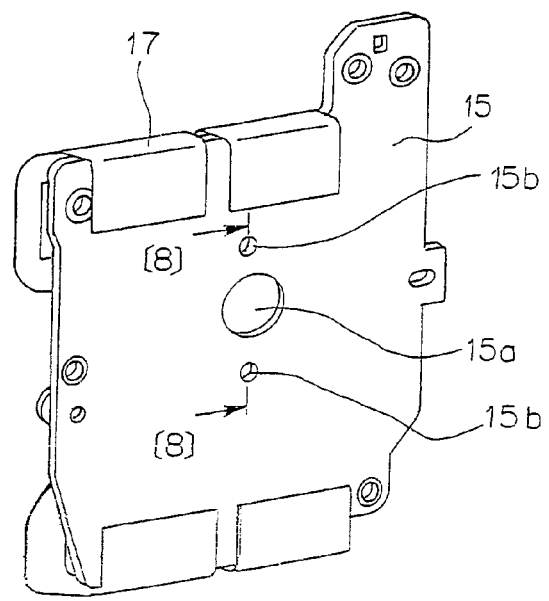
FIG. 7 is a perspective view of the completely assembled image pickup unit according to the first embodiment.
Figure 8:
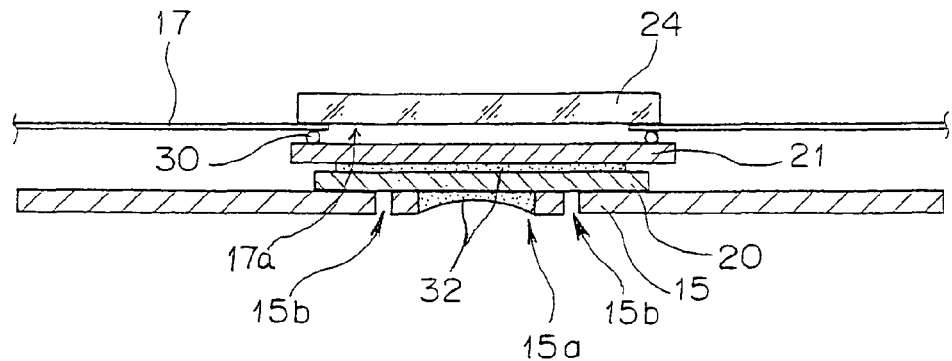
FIG. 8 is an enlarged sectional view of a critical portion of the image pickup unit, FIG. 8 showing the enlarged bonding site of an image pickup unit in which an image pickup device and a cover glass are bonded and fixed to a flexible printed circuit board, and a support.
Figure 9:
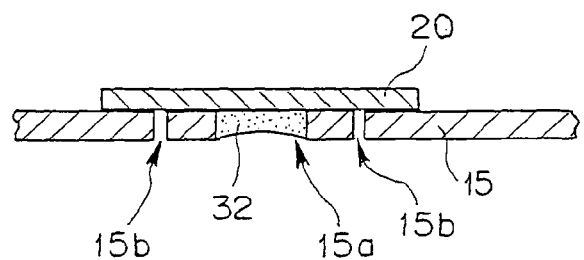
FIG. 9 is an enlarged sectional view of extracted part of the critical portion of FIG. 8 just after an adhesive is applied.
Figure 10:
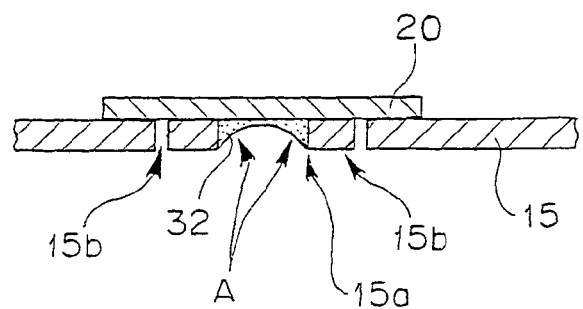
FIG. 10 is an enlarged sectional view of the part of the critical portion of FIG. 8 after the adhesive is cured.

FIGS. 1 and 2 show a mirror box of a digital single-lens reflex camera (hereinafter, simply referred to as a digital camera) to which an image pickup unit according to a first embodiment of the present invention is applied. FIG. 1 is a perspective view of the mirror box. In FIG. 1, a body mount and components unnecessary for explanation are not shown. FIG. 2 is a sectional view of the mirror box taken along the line [2]-[2] of FIG. 1. FIG. 3 is a front view of an image pickup unit according to the present embodiment. FIGS. 4 and 6 are exploded perspective views of the image pickup unit according to the present embodiment. FIG. 4 shows the image pickup unit as viewed from the front. FIG. 6 shows the image pickup unit as viewed from the rear. FIGS. 5 and 7 are perspective views of the completely assembled image pickup unit according to the present embodiment. FIG. 5 shows the image pickup unit as viewed from the front. FIG. 7 shows the image pickup unit as viewed from the rear. FIG. 8 is an enlarged sectional view of a critical portion of the image pickup unit according to the present embodiment, FIG. 8 showing the enlarged bonding site of an image pickup unit in which an image pickup device and a cover glass are bonded and fixed to a flexible printed circuit board, and a support. FIGS. 9 and 10 are enlarged sectional views of extracted part of the critical portion of FIG. 8. FIG. 9 shows a state of the part just after an adhesive is applied on the rear surface of the image pickup device by an adhesive application method (potting). FIG. 10 shows a state thereof where the adhesive has been cured after a lapse of predetermined time. The sectional views of FIGS. 9 and 10 are taken along the line [8]-[8] of FIG. 7.

Referring to FIG. 1, a mount plane 13a on which a body mount 13 (not shown in FIG. 1, refer to FIG. 2) is arranged is displaced in front of a body 11 of a mirror box 10. The body mount 13 is arranged in order to permit a photographic lens barrel (not shown) having a photographic optical system to be detachable from the body 11. Therefore, the body mount 13 is set so as to ensure the following arrangement: When the lens barrel (not shown) is attached to the body mount 13, the optical axis O (refer to FIG. 2) of the photographic optical system of the lens barrel extends through substantially the center of the body mount 13 and the mount plane of the body mount 13 is substantially perpendicular to the optical axis O of the photographic optical system.

On the rear of the body 11, the image pickup unit according to the present embodiment is fixed. The image pickup unit comprises an image pickup device 21, which will be described later, a support 15, a protector 16, and a flexible printed circuit board (FPC) 17 and the like.

As shown in FIGS. 2 to 5, the image pickup unit according to the present embodiment essentially comprises the support 15, the protector 16, the FPC 17, a heat releasing member 20, the image pickup device 21, and a cover glass 24.

More specifically, the image pickup unit is constructed in such a manner that the protector 16, the FPC 17, the heat releasing member 20, the image pickup device 21, and the cover glass 24 are put together in accordance with a predetermined procedure and are then fixed to the support 15 using an adhesive 32 (refer to FIG. 8), which will be described below.

The support 15 serves as a reference member for positioning the image pickup unit at the mirror box 10. The support 15 on which the image pickup device is bonded is fixed to the mirror box 10.

The support 15 is constituted by a plate-shaped rigid material made of metal, such as aluminum or stainless steel, ceramic, or a molded component.

In substantially the center of the support 15, a hole 15a, serving as, e.g., a substantially circular opening, is formed. In the vicinity of the hole 15a, holes 15b each having a smaller diameter than that of the hole 15a are formed. The holes 15b are arranged at opposite sides of the hole 15a such that one hole is disposed in each side.

The protector 16 is fixed to the FPC 17. The protector 16 has a function of protecting the bonding site of the image pickup device 21, the cover glass 24, and the FPC 17 from stress caused by bending of the FPC 17 and also has a function of aligning the FPC 17 with the support 15 during assembling the image pickup unit.

The image pickup device 21 is a photoelectric transducer for performing photoelectric conversion to generate image signals corresponding to an optical subject image formed based on light passed through the photographic optical system (not shown). The image pickup device 21 is a bare chip, e.g., a charge coupled device (CCD). The image pickup device 21 has a image pickup area (not shown) on one face (light receiving surface) and also has a plurality of electrodes in portions adjacent to the image pickup area on the one face of the image pickup device 21. The electrodes are connected to connection patterns (not shown) of the FPC 17 through bumps 30 so that signals can be transferred between the FPC 17 and the image pickup device 21.

The FPC 17 is an electric board for supplying image signals, generated by photoelectric conversion through the image pickup device 21, to an electric circuit (not shown), such as an image processing circuit. In substantially the center of the FPC 17, a substantially rectangular opening 17a (refer to FIG. 4) is formed. The opening 17a is formed in order to permit light for image pickup to pass through. Accordingly, the opening 17a is set to be larger than the image pickup area of the image pickup device 21 and be smaller than the outer shape of the image pickup device 21 such that the opening 17a is located within the electrodes. On the FPC 17, the connection patterns (not shown) to be connected to the electrodes of the image pickup device 21 is formed in the vicinity of the edges of the opening 17a.

The heat releasing member 20 is disposed in order to release heat stored in the image pickup device 21. The heat releasing member 20 is arranged in substantially tight contact with the image pickup device 21. The heat releasing member 20 is constituted by a flat plate material made of, e.g., ceramic.

The cover glass 24 is larger than the image pickup device 21 in outer shape. The cover glass 24 is disposed such that it is opposed to the light receiving surface (image pickup area) of the image pickup device 21, thus protecting the image pickup area of the image pickup device 21. The cover glass 24 is constituted by a flat plate transparent material made of, e.g., glass.

The cover glass 24 is fixed to the face of the FPC 17 on which the image pickup device is not fixed by a second adhesive 25 such that the opening 17a is covered with the cover glass 24.

As shown in FIG. 2, in front of the cover glass 24, an optical low-pass filter (hereinafter, abbreviated to an optical LPF) 26 and a shutter 27 are arranged in that order. The optical LPF 26 eliminates a high frequency component from light reflected from a subject (hereinbelow, referred to as subject light), the light passing through the photographic optical system (not shown) and being incident on the optical LPF 26. The shutter 27 controls the irradiation period of the subject light incident on the light receiving surface of the image pickup device 21.

The components of an image pickup apparatus according to the present embodiment are arranged as follows.

The image pickup device 21 is arranged on one face of the FPC 17, i.e., the rear surface thereof such that the opening 17a is covered with the image pickup device 21. In this case, the FPC 17 and the image pickup device 21 are fixed to each other by a first adhesive (not shown), at least mechanically.

In other words, a portion surrounding the opening 17a on the rear face of the FPC 17 is fixed to the ends of the one face of the image pickup device 21, i.e., the light receiving surface (with the image pickup area) excluding the bumps for the electrodes (refer to FIG. 8) by the first adhesive (not shown).

More specifically, the first adhesive (not shown) is applied to a portion having a first width on the image pickup device 21. The portion includes at least predetermined spaces in the two ends and the other two ends of the image pickup device 21. Each predetermined space is formed between the edge of the image pickup device 21 and the corresponding area for the electrical connection between the connection patterns of the FPC 17 and the electrodes of the image pickup device 21. In other words, the first adhesive (not shown) is applied to a predetermined portion surrounding the opening 17a of the FPC 17.

The first adhesive is applied over the peripheries of the electrodes. Thus, the image pickup device 21 is fixed to the predetermined portion on the rear face of the FPC 17 such that the image pickup area of the image pickup device 21 is exposed through the opening 17a.

A portion surrounding the opening 17a on the other face of the FPC 17, i.e., the front surface thereof is fixed to ends of the rear-side face of the cover glass 24 using the second adhesive 25.

More specifically, the second adhesive 25 is applied to the portion surrounding the opening 17a of the FPC 17. The portion has a second width. As the second adhesive 25, e.g., an ultraviolet cure adhesive is used.

The cover glass 24 is bonded to the FPC 17, thus providing a seal structure for sealing a space between the cover glass 24 and the light receiving surface of the image pickup device 21 to protect the light receiving surface.

On the other hand, the heat releasing member 20 is bonded on the rear face of the image pickup device 21, i.e., on the surface on which the light receiving area is not provided by an adhesive (refer to FIG. 2).

In addition, the support 15 is bonded to the rear face of the heat releasing member 20, by the adhesive 32 applied in the hole 15a penetrated in the support 15. The holes 15b are used to bond the heat releasing member 20 to the support 15.

The support 15 is fixed to predetermined portions of the body 11 by means of screws. Thus, the image pickup device 21 is secured to the predetermined portions of the body 11 of the mirror box 10.

The bonding site of the FPC 17, the cover glass 24, and the image pickup device 21 will now be described in detail below.

Referring to FIG. 8, the ends of the light receiving surface of the image pickup device 21, are fixed on the portion surrounding the opening 17a on the rear face of the FPC 17 by the adhesive (not shown). As this adhesive, an insulating adhesive is used. Therefore, the peripheries of the electrodes are covered with the insulating adhesive, whereby the insulation between the electrodes can be ensured.

On the front surface of the FPC 17, i.e., on the surface on which the image pickup device is not mounted, the cover glass 24 is fixed by an adhesive (not shown) such that the opening 17a is covered with the cover glass 24. In this case, the adhesive is interposed between the ends of the cover glass 24 and the portion surrounding the opening 17a of the FPC 17.

The heat releasing member 20 is fixed on the rear face of the image pickup device 21 by face-bonding with the adhesive 32. In addition, the support 15 is bonded on the rear face of the heat releasing member 20 by an adhesive application method (potting), i.e., pouring the adhesive 32 into the hole 15a. As the adhesive 32, a photocurable or thermosetting epoxy adhesive, alternatively, a one-part thermosetting epoxy adhesive or the like is used.

A procedure for bonding the heat releasing member 20 to the support 15 will now be described in more detail.

The image pickup unit constructed as described above, i.e., by bonding the cover glass 24 and the image pickup device 21 to the predetermined portions of the FPC 17 and bonding the heat releasing member 20 to the image pickup device 21, is fixed to a predetermined portion of the support 15 using the adhesive 32.

In this case, the image pickup unit is aligned with the support 15 and they are pressurized. After that, the rear surface of the support 15, i.e., the surface thereof shown in FIG. 7 is turned up. In this instance, the rear face of the heat releasing member 20 is partially exposed through the holes 15a and 15b.

In this state, e.g., an instant adhesive is applied to the heat releasing member 20 through the two holes 15b. Then, the heat releasing member 20 is bonded to the support 15. Consequently, the image pickup device 21 and the support 15 are tentatively fixed to each other with the heat releasing member 20 therebetween at a specified position. In this state, the pressing force is released.

Subsequently, the adhesive 32 is poured into the hole 15a by the adhesive application method (potting). FIG. 9 shows that state. In the state shown in FIG. 9, heat or predetermined light is applied to cure the adhesive 32. Thus, the adhesive 32 is shrinking during curing and is then cured in a form as shown by arrows A in FIG. 10. In this instance, stress caused by the shrinkage of the adhesive 32 is diffused in the surface of the adhesive 32 itself. Therefore, the stress caused during curing of the adhesive 32 has no effect on the other components.

In other words, as for the shrinkage of the adhesive applied by the adhesive application method (potting), shrinking part of the adhesive is exposed in a large area, so that the shrinkage caused by curing can be absorbed by the exposed large part. In such potting, the contact area of an adhesive with an adhered is small. Therefore, the shrinking force of the adhesive is hardly applied to the adhered during curing of the adhesive.

In conventionally used face-bonding, disadvantageously, the degree of spread (application area) of an adhesive depends on the application amount of adhesive or a pressure applied to an adhered.

On the other hand, in potting, an adhesive is supplied into a frame with a predetermined size, i.e., the hole 15a. Advantageously, the form of the adhesive after application is always stable. Thus, the application area is also stable. Therefore, the shrinking force of the adhesive is also stable during curing.

The image pickup device 21 is constituted by a plate member which comprises a silicon wafer and has a thickness of, e.g., 0.65 mm. Therefore, the image pickup device 21 has the property of being easily deformed in the direction substantially perpendicular to the surface of the plate. Accordingly, when the image pickup device 21 is fixed to the support 15 by face-bonding, the image pickup device 21 tends to be deformed by the influence of the shrinking force of the adhesive 32 during curing.

According to the present embodiment, as described above, the image pickup device 21 (i.e., the heat releasing member 20 fixed on the image pickup device 21 by face-bonding in the present embodiment) is bonded to the support 15 by potting the adhesive 32, thus reducing the shrinking force of the adhesive 32. In this instance, the potting area is limited to the hole 15a, thus further reducing the shrinking force of the adhesive 32 during curding.

When the area of adhesion is small as described above, the adhesive strength may decrease. According to the present embodiment, in consideration of the above problem, a one-part thermosetting epoxy adhesive (hereinafter, referred to as an epoxy adhesive) or the like is used to provide a sufficient adhesive strength.

As for the adhesive strength of the epoxy adhesive, when the epoxy adhesive is applied to a metallic material for bonding, cohesive failure occurs in some cases. The cohesive failure is a phenomenon caused when the cohesive strength of the adhesive is smaller than the adhesive strength at the interface between the adhesive and the metallic material. As long as the cohesive failure strength satisfies the necessary strength of a product, there is no problem with respect to the strength. For example, as long as the adhesive strength not less than ten times as high as the weight of a product is ensured, the strength of the product has no problem.

The epoxy adhesive exhibits a high adhesive strength or a high reliability with metallic materials (excluding stainless steel and brass) and has the property of being hardly deformed by an external force. For example, as for elongation at break that means the strain required to break an adhesive under the application of stress, the elongation at break of the epoxy adhesive is several percent or lower. The elongation at break of a silicon adhesive is generally 100% or higher. Accordingly, it is understood that the epoxy adhesive is hardly deformed.

Therefore, as long as the necessary adhesive strength of an adhesive is ensured and the elongation at break thereof is several percent, the influence of an external force on the image pickup device 21 bonded using the adhesive, e.g., the warping of the image pickup device 21 can be minimized. When the image pickup device 21 is used in a digital camera, it is obvious that an external force applied to the image pickup device 21 is approximately several hundreds of grams (g). Therefore, when the image pickup device 21 (heat releasing member 20) is bonded to the support 15 using the epoxy adhesive, the necessary adhesive strength is sufficiently satisfied.

In the present embodiment, the heat releasing member 20 is interposed between the image pickup device 21 and the support 15. In this case, the heat releasing member 20 is fixed on the support 15 using the adhesive 32 by potting. On the other hand, the image pickup device 21 is fixed on the heat releasing member 20 with the adhesive 32 by face-bonding. Therefore, in the region of face-bonding, either the image pickup device 21 or the heat releasing member 20, or both of them may be deformed due to the shrinking force of the adhesive 32 during curing thereof.

However, although the composition of the image pickup device 21 is not completely identical to that of the heat releasing member 20, the material for the image pickup device 21 has substantially the same physical properties (e.g., the stress-strain property, coefficient of linear expansion, and the like) as those of the material for the heat releasing member 20. From this fact, the image pickup device 21 and the heat releasing member 20 are not significantly deformed, e.g., warped.

On the other hand, when a sub-assembly constituted by the image pickup device 21 and the heat releasing member 20 is fixed to the support 15 by face-bonding, the sub-assembly and the support 15 may be deformed by the shrinking force of the adhesive 32 during curing thereof because the physical properties of the support 15 are remarkably different from those of the heat releasing member 20 directly bonded to the support 15. According to the present embodiment, therefore, the above-described stress relaxation measure is taken against the above problem, i.e., the hole 15a is formed in the support 15 and the adhesive 32 is poured into the hole 15a (potting).

As explained above, according to the first embodiment, the cover glass 24 and the image pickup device 21 are fixed to the predetermined portions of the FPC 17, the heat releasing member 20 is fixed to the image pickup device 21, and the support 15 made of a rigid material is fixed to the heat releasing member 20 so that such a sub-assembly is reliably disposed at a predetermined position in an electronic apparatus, such as a digital camera, thus providing the image pickup unit with this arrangement.

In incorporating this image pickup unit into the electronic apparatus, such as a digital camera, the support can be used as a positioning reference in the apparatus. Advantageously, the image pickup device secured on the support can be reliably positioned in the apparatus body.

To fix the image pickup device 21 to the support 15 with the heat releasing member 20 therebetween, the epoxy-based adhesive 32 is poured into the hole 15a formed in the support 15. Thus, although the area of bonding is small, the sufficient adhesive strength can be ensured. In addition, the shrinking force of the adhesive 32 caused during curing thereof has no effect on the heat releasing member 20 (indirectly, the image pickup device 2) serving as an adhered. Thus, the deformation of the adhered due to the shrinking force of the adhesive 32 is prevented.

In the above-described first embodiment, the adhesive 32 is directly interposed between the heat releasing member 20 and the support 15. As described above, the heat releasing member 20 is integrated with the image pickup device 21. In addition, the material for the heat releasing member 20 has substantially the same physical properties as those of the material for the image pickup device 21. Although the heat releasing member 20 is arranged on the rear surface of the image pickup device 21, the heat releasing member 20 can be regarded as part of the image pickup device 21.

An image pickup unit according to a second embodiment of the present invention will now be described below.

Figure 11:
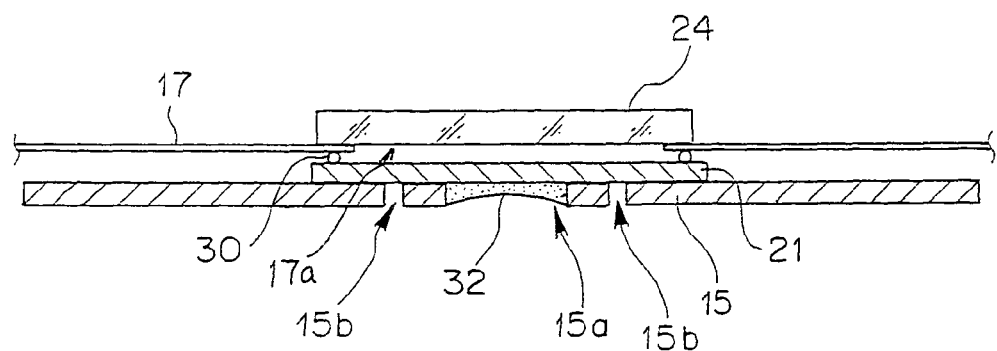
FIG. 11 is an enlarged sectional view of a critical portion of an image pickup unit according to a second embodiment of the present invention.

FIG. 11 is an enlarged sectional view of a critical portion of the image pickup unit according to the second embodiment of the present invention. More specifically, FIG. 11 shows the enlarged bonding site of an image pickup device and a cover glass being bonded and fixed to a flexible printed circuit board, and the image pickup device being bonded to a support in the image pickup unit according to the present embodiment.

The fundamental structure of the present embodiment is substantially the same as that of the above-described first embodiment. The second embodiment differs from the first embodiment in that the heat releasing member is eliminated from the components of the image pickup unit according to the first embodiment. Therefore, the same components as those in the first embodiment are designated by the same reference numerals and the detailed description of the previously explained components is omitted. Different portions will now be described below.

Referring to FIG. 11, in the image pickup unit according to the present embodiment, a cover glass 24 is adhered on one face of a flexible printed circuit board (FPC) 17 so as to cover an opening 17a formed in the FPC 17. An image pickup device 21 comprising a bare chip is adhered on the other face of the FPC 17 so as to cover the opening 17a. A support 15 is bonded on the rear face of the image pickup device 21 by potting, e.g., in such a manner that an adhesive 32 is poured into a hole 15a formed in the support 15.

In this case, a procedure for bonding the image pickup device 21 to the support 15 is the same as the procedure for bonding the heat releasing member 20 to the support 15 in the above-described first embodiment. The other components and arrangement are exactly the same as those in the first embodiment.

As described above, according to the second embodiment, although the image pickup device 21 bonded on the support 15 does not include the heat releasing member 20, the same advantages as those of the first embodiment can be obtained. However, the image pickup unit including the heat releasing member 20 according to the first embodiment is more preferable than that according to the second embodiment because heat distribution in the image pickup device 21 can be uniformed.

In the first and second embodiments, the support 15 has the hole 15a for potting. The hole 15a having a substantially circular shape is formed in substantially the center of the support 15. However, the shape of the hole 15a and the position thereof in the support 15 are not limited to the above examples.

Figure 12:
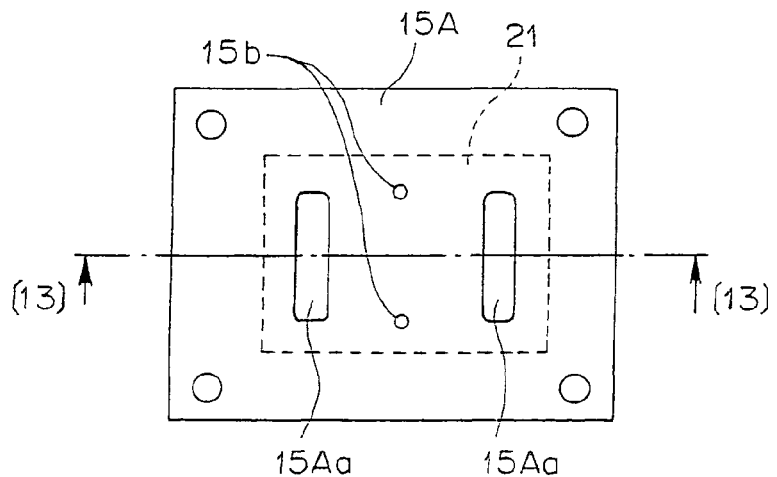
FIG. 12 is a diagram showing a shape and a position of holes for potting in a support according to a first modification used in an image pickup apparatus according to the present invention.
Figure 14:
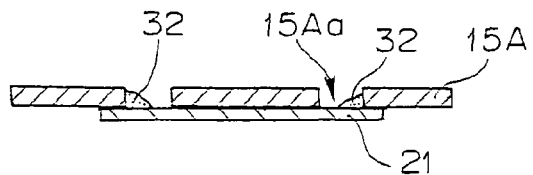
FIG. 14 is a sectional view taken along the line [13]-[13] of FIG. 12, FIG. 14 showing a state after the adhesive is cured.
Figure 13:
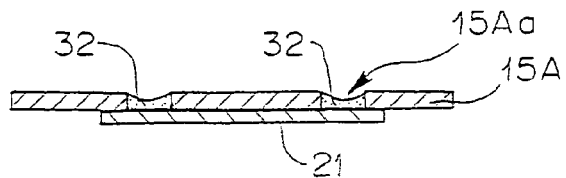
FIG. 13 is a sectional view taken along the line [13]-[13] of FIG. 12, FIG. 13 showing a state just after an adhesive is applied.

For instance, FIG. 12 shows a shape and a position of holes for potting in a support according to a first modification. FIGS. 13 and 14 are sectional views taken along the line [13]-[13] of FIG. 12. FIG. 13 shows a state just after an adhesive is applied. FIG. 14 shows a state after the adhesive is cured.

Referring to FIG. 12, in a support 15A according to the present modification, two holes 15Aa each having an elongated rectangular shape are formed in a portion corresponding to the image pickup device 21 (or the heat releasing member), serving as an adhered. The holes 15Aa are adjacent to both sides of the portion, respectively.

In this case, the area of each hole 15Aa can be increased. In addition, an adhesive is applied in two places for bonding. Thus, a higher adhesive strength can be obtained.

Figure 15:
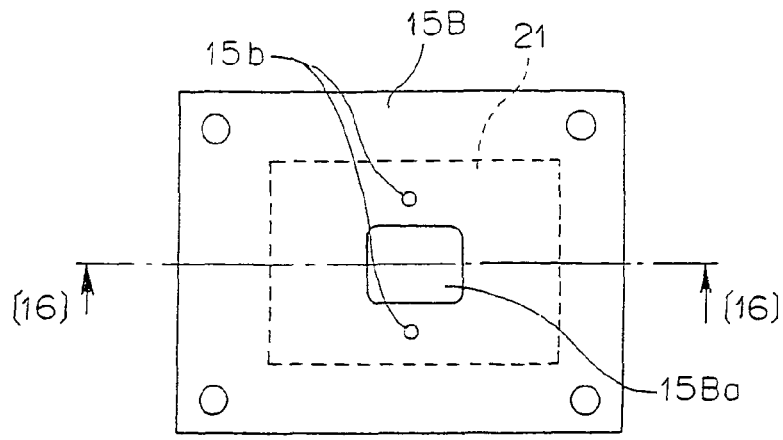
FIG. 15 is a diagram showing a shape and a position of holes for potting in a support according to a second modification used in the image pickup apparatus according to the present invention.
Figure 17:
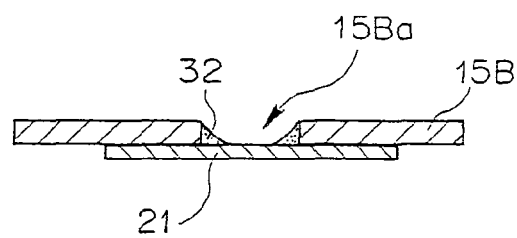
FIG. 17 is a sectional view taken along the line [16]-[16], FIG. 17 showing a state after the adhesive is cured.
Figure 16:
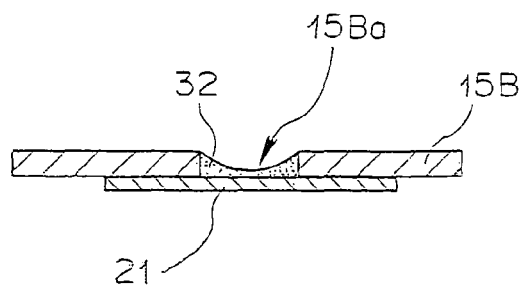
FIG. 16 is a sectional view taken along the line [16]-[16] of FIG. 15, FIG. 16 showing a state just after an adhesive is applied.

FIG. 15 shows a shape and a position of holes for potting in a support according to a second modification. FIGS. 16 and 17 are sectional views at the line [16]-[16] of FIG. 15. FIG. 16 shows a state just after an adhesive is applied. FIG. 17 shows a state after the adhesive is cured.

Referring to FIG. 15, in a support 15B according to the present modification, one rectangular hole 15Ba is formed in a portion corresponding to the image pickup device 21 (or the heat releasing member), serving as an adhered. The hole 15Ba is positioned in substantially the center of this portion.

Figure 18:
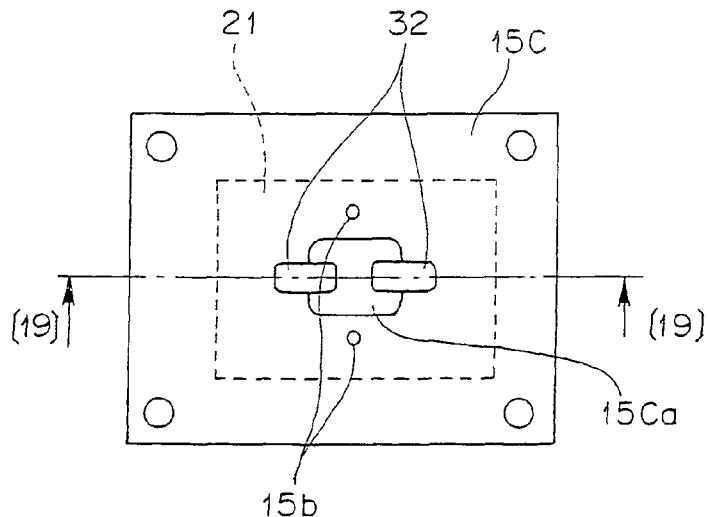
FIG. 18 is a diagram showing a shape and a position of holes for potting in a support according to a third modification used in the image pickup apparatus according to the present invention.
Figure 19:
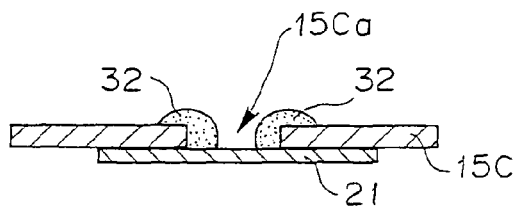
FIG. 19 is a sectional view taken along the line [19]-[19] of FIG. 18.

FIG. 18 shows a shape and a position of holes for potting in a support according to a third modification. FIG. 19 is a sectional view taken along the line [19]-[19] of FIG. 18.

Referring to FIG. 18, a support 15C according to the present modification has a hole 15Ca having the same shape as that in the above-described second modification (FIG. 15). The hole 15Ca is formed in the same position as that in the second modification. The third modification differs from the second modification in the way of applying the adhesive 32. In other words, as shown in FIG. 19, the adhesive 32 is applied such that the rear surface of the image pickup device 21 exposed through the hole 15Ca of the support 15C, the inner wall surface of the hole 15Ca, and the rear surface of the support 15C are partially covered with the adhesive 32. The adhesive 32 is applied at two opposite positions in the inner periphery of the hole 15Ca.

Figure 20:
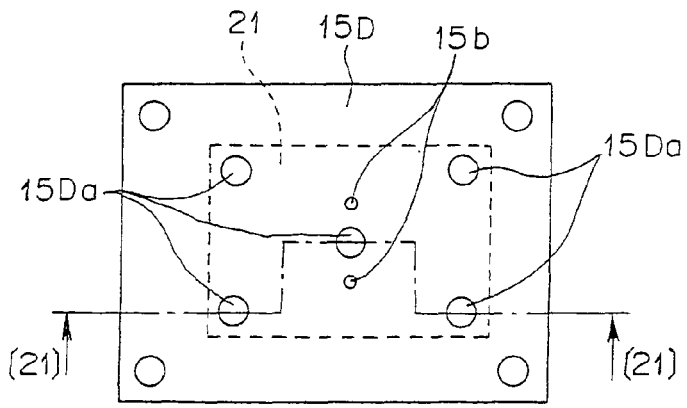
FIG. 20 is diagram showing a shape and a position of holes for potting in a support according to a fourth modification used in the image pickup apparatus according to the present invention.
Figure 21:
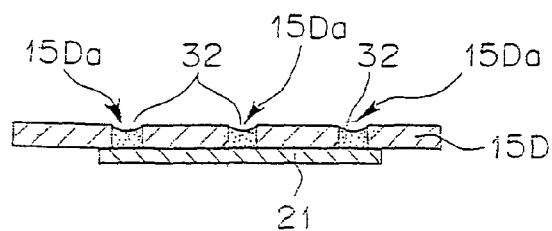
FIG. 21 is a sectional view taken along the line [21]-[21] of FIG. 20.

FIG. 20 shows a shape and a position of holes for potting in a support according to a fourth modification. FIG. 21 is a sectional view taken along the line [21]-[21] of FIG. 20.

Referring to FIG. 21, in a support 15D according to the fourth modification, substantially circular holes 15Da are formed in a portion corresponding to the image pickup device 21 (or the heat releasing member), serving as an adhered. The holes 15Da are positioned in substantially the center and the four corners of this portion. In this case, the diameter of each hole 15Da, i.e., the area thereof is slightly smaller than those of the holes according to the above-described embodiments and modifications.

In this case, the plurality of holes 15Da are arranged at substantially regular spacings in the portion to be bonded to the adhered. Thus, the area of each hole 15Da can be reduced and the necessary adhesion area can be ensured.

In the above-described embodiments, a flat plate transparent member made of, e.g., glass is used as the cover glass 24. The cover glass 24 is not limited to this example. For example, a low-pass filter or an infrared cut filter may be used as the cover glass 24.

In the above-described embodiments, the FPC 17 is used as an electric board. The electric board is not limited to the FPC 17. For instance, a rigid thin board may be used as the electric board.

In the above-described embodiment, the image pickup device 21 is adhered on the FPC 17, serving as an electric board, using the insulating adhesive. The adhesion is not limited to that case. For example, the image pickup device 21 may be adhered to the FPC 17 using an adhesive containing conductive particles exhibiting conductivity under pressure.

An image pickup apparatus according to a third embodiment of the present invention will now be described below.

Figure 22:
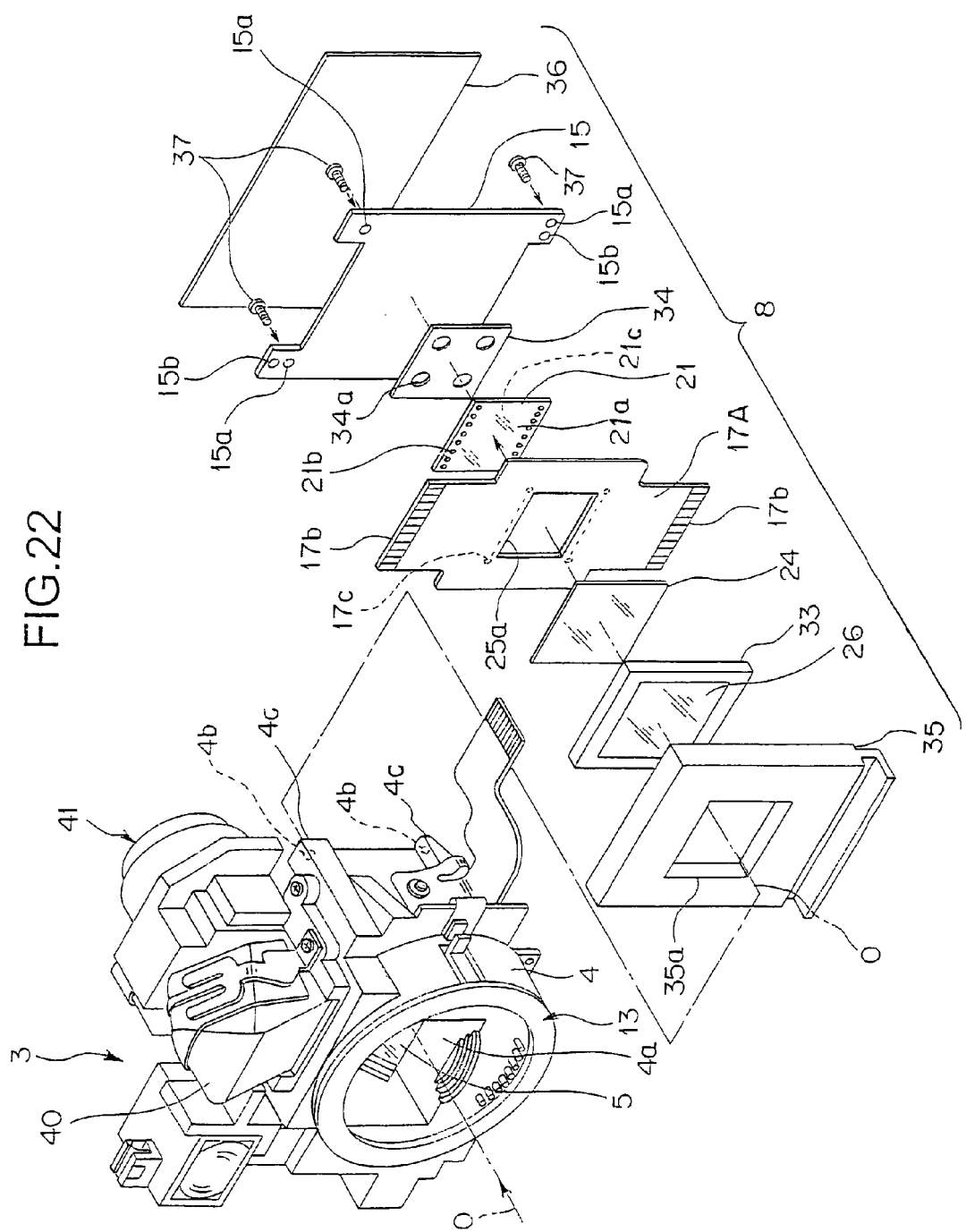
FIG. 22 is an exploded perspective view of an image pickup apparatus including an image pickup apparatus according to a third embodiment of the present invention.
Figure 23:
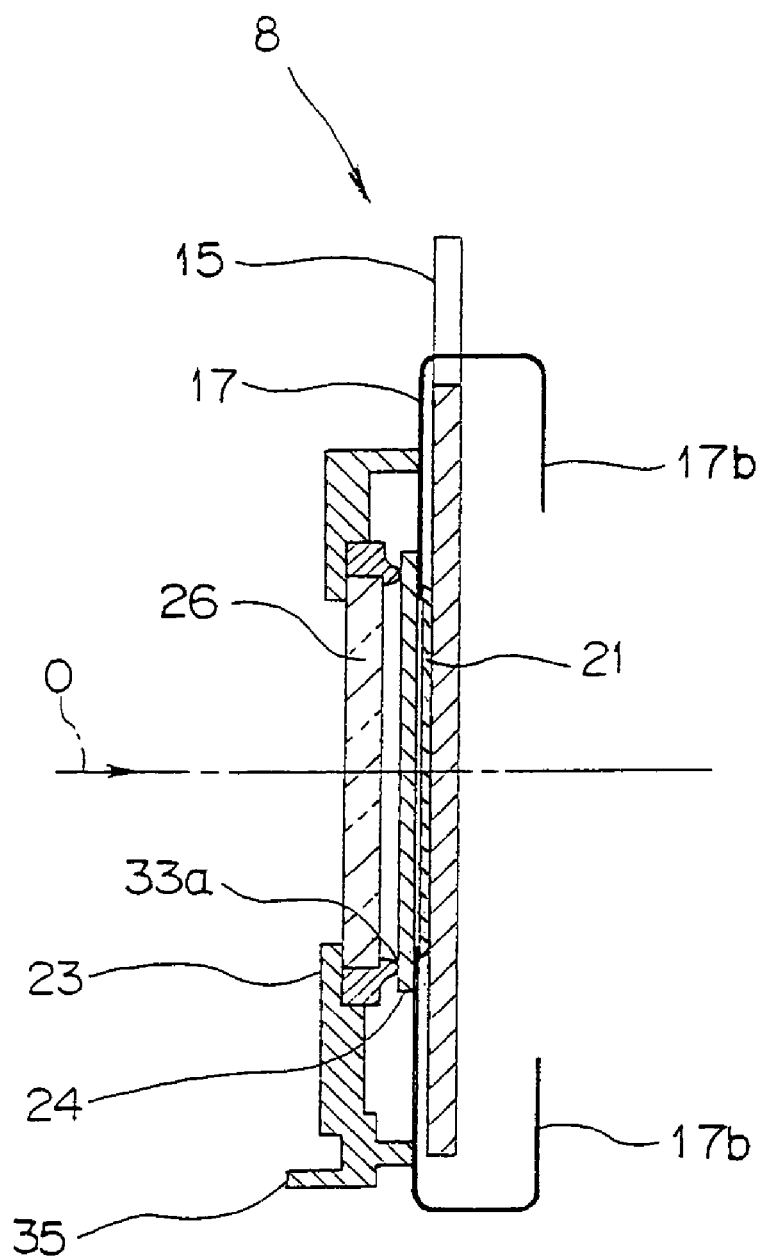
FIG. 23 is an enlarged sectional view of a critical portion of the image pickup apparatus shown in FIG. 22.

FIG. 22 is an exploded perspective view of an image pickup apparatus including the image pickup unit according to the third embodiment of the present invention. FIG. 22 shows a camera body of a camera, serving as the image pickup apparatus. FIG. 23 is an enlarged sectional view of a critical portion of the image pickup apparatus including the image pickup unit in FIG. 22.

The camera into which the image pickup unit according to the present embodiment is incorporated is a single lens reflex type. The camera essentially includes a camera body and a lens barrel detachable from the camera body, and the like. The lens barrel includes an optical component (e.g., a photographic lens) and an iris mechanism. It is assumed that the camera body and the lens barrel of this camera are similar to those of a general single lens reflex camera. The entire of the camera and the lens barrel are not shown and the details of the camera body is omitted.

The image pickup unit according to the present embodiment is received at a predetermined position in the camera body of the camera. The image pickup apparatus (camera) includes a body structure 4 (corresponding to the mirror box 10 (refer to FIG. 2) in the foregoing embodiments) having a central opening 4a (refer to FIG. 22), the body structure 4 being fixed to the camera body and supported thereby, the central opening 4a extending along an optical axis O; a body mount 13, serving as a photographic-lens support from which the lens barrel (not shown) is detachable; a main mirror 5, serving as a component arranged in the direction along the optical axis O in the central opening 4a of the body structure 4; a shutter (not shown in FIGS. 22 and 23, refer to reference numeral 27 in FIG. 2); an image pickup unit 8; a focusing screen (not shown); a pentaprism 40; and an eyepiece 41. The focusing screen and the pentaprism 40 constitute a finder device fixed to the upper portion of the body structure 4.

The image pickup unit 8 is disposed in the rear of the shutter 27 (not shown), which is arranged in the rear of the main mirror 5. As shown in FIGS. 22 and 23, the image pickup unit 8 includes: a support 15, the support 15 serving as a member for supporting an image pickup device and also serving as a plate on which the image pickup device is fixed; an image pickup device 21, the rear face of which is adhered on the support 15 with an insulating sheet 34 (not shown in FIG. 23) therebetween; a flexible printed circuit board (FPC) 17A being attached to the front-side face 21a of the image pickup device 21; a cover glass 24 made of a material that is transparent to light; an optical LPF 26 supported by a rubber frame 33; and a holder 35 for holding the rubber frame 33 and the optical LPF 26.

In the rear of the support 15, a circuit board 36 on which interface circuit parts and image processing circuit parts are mounted is disposed.

The support 15 is constituted by an aluminum plate or a stainless steel plate. The support 15 holds the image pickup device 21 and has a function of releasing heat in the image pickup device 21. The support 15 is fixed to image-pickup-unit supports 4c (refer to FIG. 22) at the rear of the body structure 4 as will be described below.

The insulating sheet 34 is a very thin sheet-like member having a predetermined size. The insulating sheet 34 is penetrated and formed with holes 34a for adhesive application.

The FPC 17A has an opening 17a at substantially the center. The FPC 17A also has connector portions 17b at both ends. On the rear surface of the FPC 17A, connection patterns 17c are arranged in the vicinity of the periphery of the opening 17a.

The image pickup device 21 is a bare-chip type (unpackaged) image pickup device. Connection bumps 21b are arranged in the vicinities of edges of the front-side face 21a of the image pickup device 21 so as to correspond to the connection patterns 17c of the FPC 17A.

The rear-side face 21c of the image pickup device 21 is fixed to the front-side face of the support 15 through the holes 34a for applying an adhesive so as to sandwich the insulating sheet 34 therebetween. In this instance, an adhesive is applied into the holes 34a in the same way as in the forgoing embodiments. The image pickup device 21 is adhered and fixed on the FPC 17A such that the front-side face 21a of the image pickup device 21 is exposed through the opening 17a of the FPC 17A and the connection bumps 21b on the image pickup device 21 side are in contact with the connection patterns 17c on the FPC 17A side. In this state, an image pickup area of the image pickup device 21 is opposed to the rear surface of the lens barrel (not shown), serving as an optical component.

The cover glass 24 is fixed on the front face of the FPC 17A to hermetically cover the opening 17a. Therefore, the cover glass 24 protects the front-side face 21a of the image pickup device 21 against intrusion of dust.

The holder 35 is a frame member having an opening 35a at substantially the center. The rubber frame 33 holding the optical LPF 26 is attached to the rear surface (back side) of the opening 35a. The holder 35 in this state (i.e., on which the rubber frame 33 is attached) is secured to the front-side of the support 15 by screws or an adhesive.

On the rear surface of the rubber frame 33, a protrusion 33a (refer to FIG. 23) is formed along the entire inner periphery of the rubber frame 33. In the above-described state, i.e., in the state where the holder 35 with the rubber frame 33 attached is secured on the front-side face of the support 15, the protrusion 33a is in close contact with ends of the front surface of the cover glass 24. Thus, the front-side face of the cover glass 24 protecting the front-side face 21a of the image pickup device 21 is hermetically sealed from outside, so that the front-side face 21a of the image pickup device 21 is protected against intrusion of dust.

The image pickup unit 8, comprising the image pickup device 21, the FPC 17A, the cover glass 24, the optical LPF 26, the holder 35, which are mounted to the support 15, is aligned with the body structure 4 in such a manner that predetermined portions on the front-side of the support 15 are come into contact with the three image-pickup-unit supports 4c projecting from the rear of the body structure 4. The image pickup unit 8 is then secured to the body structure 4.

More specifically, the image-pickup-unit supports 4c of the body structure 4 respectively have a locating pin (not shown). The locating pins are inserted into location holes 15b formed in the support 15, thus positioning the support 15 perpendicular to the optical axis O. Screws 37 are inserted into holes 15a formed in the support 15 and are then screwed into screw holes 4b formed in the image-pickup-unit supports 4c. Consequently, the support 15 is fixed on the body structure 4 in the direction along the optical axis O. In addition, the connector portions 17b of the FPC 17A are inserted into predetermined connector portions (not shown) of the circuit board 36, thus electrically connecting the FPC 17A to the circuit board 36.

As described above, when the image pickup unit 8 is fixed to the rear of the body structure 4, while the support 15 is being positioned perpendicular to the optical axis O, the support 15 is come into contact with the image-pickup-unit supports 4c in the direction along the optical axis O, so that the support 15 can be secured to the body structure 4 with high positioning accuracy. The image pickup device 21 of the bare chip type is fixed on the support 15 with the insulating sheet 34 therebetween. Therefore, the distance (flange back) between the front surface of the body mount 13 arranged in front of the support 15 and the image pickup area (photoelectric conversion surface) of the image pickup device 21 fixed on the support 15 can be ensured with high accuracy in consideration of the use of the bare chip type image pickup device 21.

Further, since the image pickup device 21 is not the package type but the bare chip type and the image pickup device 21 is fixed on the support 15, comprising a metallic plate, with the thin insulating sheet 34 therebetween, heat generated in the image pickup device 21 is released through the support 15, serving as a heat releasing plate. Thus, an increase in temperature of the image pickup device 21 can be prevented. In addition, since the image pickup device 21 is the bare chip type, it has an advantage in cost.

In the present invention, it will be apparent that a wide range of different embodiments can be formed based on this invention without departing from the spirit and scope of this invention. This invention will be restricted by the appended claims but not be limited to any particular embodiment.

What is claimed is:

1. An image pickup apparatus comprising:
   an optical element permitting image pickup light to pass through;
   an electric board having connection patterns on one face, and having the optical element fixed on the other face;
   an image pickup device (1) being a bare chip, (2) being plate-shaped, (3) having an uncovered outer periphery, and (4) having an image pickup area and a mount area on the same face, the image pickup device being electrically connected to the connection patterns in the one face of the electric board such that the image pickup area is opposed to the optical element;
   a support for supporting the image pickup device, wherein the support is plate-shaped and has an opening which is supplied with an adhesive to fix the image pickup device to the support, the adhesive being supplied only in the opening of the support, wherein an area of the opening is smaller than the area of the chip, and
   wherein the electric board is a flexible printed circuit board.

2. The apparatus according to claim 1, wherein the support has a plurality of openings.

3. The apparatus according to claim 1, wherein the image pickup apparatus is a single lens reflex camera.

4. The image pickup apparatus of claim 1 wherein the adhesive supplied to the opening of the support to fix the image pickup device to the support has a concave outer surface.

5. An image pickup apparatus comprising:
   an image pickup device (1) being a bare chip, (2) being plate-shaped, (3) having an uncovered outer periphery, and (4) having an image pickup area and a mount area on the same face;
   an electric board on which the image pickup device is mounted, wherein the electric board is a flexible printed circuit board; and
   a support having an opening, the support being plate-shaped and disposed on the rear face of the mount surface of the image pickup device such that the rear face of the image pickup device is opposed to and exposed through the opening, the opening being supplied with an adhesive to fix the support to the image pickup device, the adhesive being supplied only in the opening of the support, wherein an area of the opening is smaller than the area of the chip.

6. The apparatus according to claim 5, further comprising:
   a heat releasing member is plated-shaped and arranged between the support and the image pickup device.

7. The apparatus according to claim 5, wherein the support acts as a heat releasing member.

8. The apparatus according to claim 5, wherein the electric board has an opening that surrounds the entire periphery of the image pickup area of the image pickup device so that image pickup light reaches the image pickup area through the opening.

9. The apparatus according to claim 5, further comprising:
   a photographic-lens support from which a photographic lens is detachable, wherein
   the support is fixed to the photographic-lens support.

10. The apparatus according to claim 5, wherein the support has a plurality of openings.

11. The apparatus according to claim 5, further comprising:
    an optical element that is transparent to light, the optical element being arranged on a rear face of the electric board on which the image pickup device is mounted such that the optical element is opposed to the image pickup area.

12. The apparatus according to claim 5, wherein the image pickup apparatus includes a single lens reflex camera.

13. The image pickup apparatus of claim 5 wherein the adhesive applied to the opening of the support to fix the support to the image pickup device has a concave outer surface.

14. An image pickup unit comprising:
    an optical element permitting image pickup light to pass through;
    an electric board having connection patterns on one face, and having the optical element fixed on the other face;
    an image pickup device comprising a bare chip, having an uncovered outer periphery and having an image pickup area and a mount area on the same face, the image pickup device being electrically connected to the connection patterns in the one face of the electric board such that the image pickup area is opposed to the optical element;
    a support for supporting the image pickup device; and
    a heat releasing member which is plate-shaped and arranged between the support and the image pickup device, wherein the support has an opening which is supplied with an adhesive to fix the heat releasing member to the support, the adhesive being supplied only in the opening of the support, wherein an area of the opening is smaller than the area of the chip, wherein an adhesive is applied between the heat releasing member and the image pickup device, and wherein the electric board is a flexible printed circuit board.

15. The image pickup unit of claim 14 wherein the adhesive applied to the opening of the support to fix the heat releasing member to the support has a concave outer surface.

16. An image pickup unit comprising:
    an image pickup device (1) being a bare chip, (2) being plate-shaped, (3) having an uncovered outer periphery, and (4) having an image pickup area and a mount area on the same face;
    an electric board having the image pickup device mounted thereon; and
    a support having an opening, the support being plate-shaped and disposed on the rear face of the mount surface of the image pickup device such that the rear face of the image pickup device is opposed to and exposed through the opening, the opening being supplied with an adhesive to fix the support to the image pickup device, the adhesive being supplied only in the opening of the support, wherein an area of the opening is smaller than the area of the chip.

17. The unit according to claim 16, further comprising:
    a heat releasing member which is plate-shaped and arranged between the support and the image pickup device.

18. The unit according to claim 16, wherein the support acts as a heat releasing member.

19. The unit according to claim 16, wherein the electric board has an opening that surrounds the entire periphery of the image pickup area of the image pickup device so that image pickup light reaches the image pickup area through the opening.

20. The unit according to claim 16, wherein the electric board is a flexible printed circuit board.

21. The unit according to claim 16, further comprising:
an optical element that is transparent to light, the optical element being arranged on a rear face of the electric board on which the image pickup device is mounted such that the optical element is opposed to the image pickup area.

22. The image pickup unit of claim 16 wherein the adhesive applied to the opening of the support to fix the support to the image pickup device has a concave outer surface.

23. The unit according to claim 19, wherein the support has a plurality of openings.

24. An image pickup apparatus comprising:
an image pickup device being a bare chip having an uncovered outer periphery and having an image pickup area and a mount area on the same face;
an electric board on which the image pickup device is mounted;
a support having an opening; and
a heat releasing member arranged between the support and the rear face of the mount surface of the image pickup device, wherein the support is disposed on the heat releasing member such that a rear face of the heat releasing member is opposed to and exposed through the opening, the opening being supplied with an adhesive to fix the support to the heat releasing member, the adhesive being supplied only in the opening of the support, wherein an area of the opening is smaller than the area of the chip, wherein the adhesive covers the opening such that the rear face of the heat releasing member is entirely covered with the adhesive in an area exposed to the opening.

25. The image pickup apparatus of claim 24 wherein the image pickup device and the heat releasing member are plate-shaped.

26. The image pickup apparatus of claim 24 wherein the adhesive supplied to the opening of the heat releasing member to fix the support to the heat releasing member has a concave outer surface.

27. An image pickup unit comprising:
an image pickup device (1) being a bare chip, (2) having an uncovered outer periphery and (3) having an image pickup area and a mount area on the same face;
an electric board having the image pickup device mounted thereon; and
a support having an opening, the support being disposed on the rear face of the mount surface of the image pickup device such that the rear face of the image pickup device is opposed to and exposed through the opening, the opening being supplied with an adhesive to fix the support to the image pickup device, the adhesive being supplied only in the opening of the support, wherein an area of the opening is smaller than the area of the chip, wherein the adhesive covers the opening such that the rear face of the mount surface of the image pickup device is entirely covered with the adhesive in an area exposed to the opening.

28. The image pickup unit of claim 27 wherein the image pickup device and the support are plate-shaped.

29. The image pickup unit of claim 27 wherein the adhesive supplied to the opening of the support to fix the support to the image pickup device has a concave outer surface.

* * * * *